(12) United States Patent
Freeman et al.

(10) Patent No.: US 7,307,425 B2
(45) Date of Patent: Dec. 11, 2007

(54) RECEIVER ELECTRONICS PROXIMATE ANTENNA

(75) Inventors: James J. Freeman, Spring, TX (US); Imran Vehra, Houston, TX (US); Christopher A. Golla, Houston, TX (US); Sergei Sharonov, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 23 days.

(21) Appl. No.: 10/992,129

(22) Filed: Nov. 18, 2004

(65) Prior Publication Data

US 2005/0168224 A1 Aug. 4, 2005

Related U.S. Application Data

(60) Provisional application No. 60/520,992, filed on Nov. 18, 2003, provisional application No. 60/520,950, filed on Nov. 18, 2003.

(51) Int. Cl.
*G01V 3/30* (2006.01)

(52) U.S. Cl. ..................................... 324/338; 324/339
(58) Field of Classification Search ........ 324/338–339, 324/341, 334, 346, 343
See application file for complete search history.

(56) References Cited

U.S. PATENT DOCUMENTS

| 4,845,494 | A | * | 7/1989 | Hanson et al. ............ 340/854.5 |
| 4,899,112 | A | * | 2/1990 | Clark et al. .................. 324/338 |
| 5,278,507 | A | * | 1/1994 | Bartel et al. ................. 324/338 |
| 6,353,321 | B1 | * | 3/2002 | Bittar .......................... 324/338 |
| 6,777,940 | B2 | * | 8/2004 | Macune ....................... 324/338 |

* cited by examiner

*Primary Examiner*—Reena Aurora
(74) *Attorney, Agent, or Firm*—Conley Rose, P.C.

(57) ABSTRACT

A resistivity tool includes receiver electronics near each receiver antenna loop. Placement of the electronics in this position such as at the circuit card between the terminal ends of the receiver antenna loop improves signal to noise ratio by reducing or eliminating interference, noise, and cross-talk of transmissions from the receiver to a remote microprocessor. By using material such as silicon-on-sapphire, electronics can be miniaturized and operate reliably at when exposed to high temperatures, even for long periods.

21 Claims, 5 Drawing Sheets

RECEIVER ELECTRONICS PROXIMATE ANTENNA

CROSS-REFERENCE TO RELATED APPLICATIONS

This application is a Nonprovisional application of U.S. application Ser. No. 60/520,992 filed Nov. 18, 2003, and entitled "High Temperature Electronics Suitable For Downhole Use" and U.S. application Ser. No. 60/520,950 filed Nov. 18, 2003, and entitled "High Temperature SIC Electronics Suitable For Downhole Use, High Temperature SIC Circuits, And Receiver SIC Electronics Proximate Antenna" which are incorporated herein by reference in their entirety.

STATEMENT REGARDING FEDERALLY SPONSORED RESEARCH OR DEVELOPMENT

Not Applicable.

BACKGROUND OF THE INVENTION

Modern petroleum drilling and production operations demand a great quantity of information relating to parameters and conditions downhole. Such information typically includes characteristics of the earth formations traversed by the borehole, along with data relating to the size and configuration of the borehole itself. The collection of information relating to conditions downhole, which commonly is referred to as "logging", can be performed by several methods.

As drilling technology improves, there has been an evolution in downhole tools and downhole measurement techniques. A variety of formation sensors or measurement devices are known, including resistivity tools. One conventional technique was referred to as "wireline" and is still employed. Formation sensors were suspended from a probe (or "sonde"), and the sonde is lowered into the borehole after some or all of the well has been drilled. The formation sensors are used to determine certain characteristics of the formations traversed by the borehole. The upper end of the sonde is attached to a conductive wireline that suspends the sonde in the borehole. Power is transmitted to the instruments in the sonde through the conductive wireline. Conversely, the instruments in the sonde communicate information to the surface using electrical signals transmitted through the wireline.

An alternative method of logging is the collection of data during the drilling process. Collecting and processing data during the drilling process eliminates the necessity of removing the drilling assembly to insert a wireline logging tool. It consequently allows the driller to make accurate modifications or corrections as needed to optimize performance while minimizing down time. "Measurement-while-drilling" (MWD) is the term for measuring conditions downhole concerning the movement and location of the drilling assembly while the drilling continues. "Logging-while-drilling" (LWD) is the term for similar techniques, which concentrate more on the measurement of formation parameters. While distinctions between MWD and LWD may exist, the terms MWD and LWD often are used interchangeably. For the purposes of this disclosure, the term LWD will be used with the understanding that this term encompasses both the collection of formation parameters and the collection of information relating to the movement and position of the drilling assembly.

In LWD systems, sensors typically are located at the lower end of the drill string. More specifically, the downhole sensors are typically positioned in a cylindrical drill collar positioned near the drill bit. While drilling is in progress these sensors continuously or intermittently monitor predetermined drilling parameters and formation data and transmit the information to a surface detector by some form of telemetry.

Figure 1:
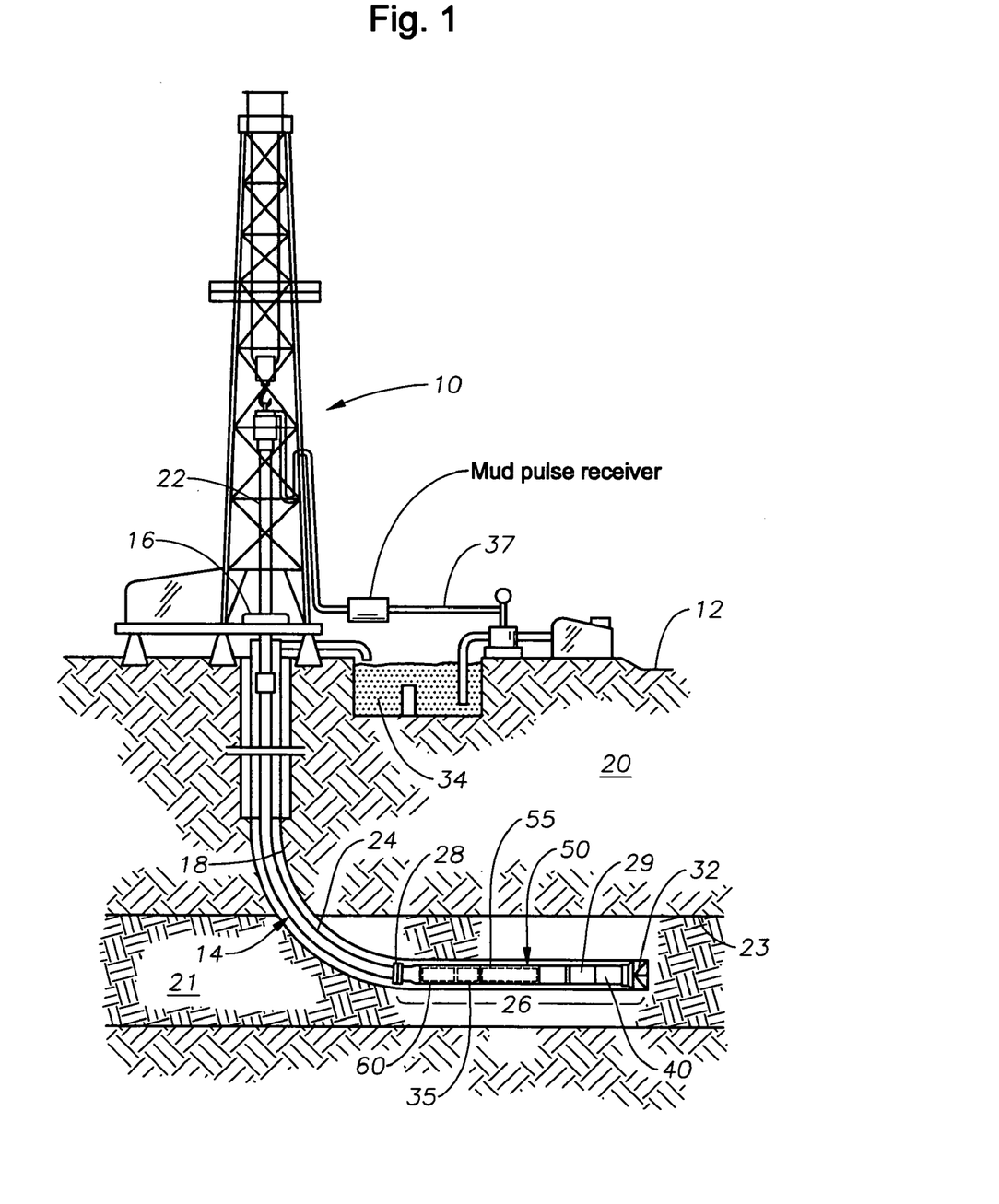
FIG. 1 is a shows a representative logging-while-drilling (LWD) configuration.

Referring now to FIG. 1, a drilling installation is shown. A drilling rig 10 at the surface 12 of the well supports a drill string 14. The drill string 14 penetrates through a work platform 16 and into a borehole 18 that is drilled through earth formations 20 and 21. The drill string 14 may comprise coil tubing 24 from a spool 22 at its upper end, and a bottom hole assembly 26 (commonly referred to as a "BHA") coupled to the lower end of the coil tubing 24. The BHA 26 may include a drill bit 32, a downhole motor 40, one or more drill collars 28, resistivity tool 50 mounted on collar section 55, LWD sensors positioned in a collar section 55, directional MWD sensors located in a non-magnetic section 60, and one or more stabilizer(s) (not shown) for penetrating through earth formations to create the borehole 18. As shown in FIG. 1, BHA 26 is defined as all of the downhole components from the top of the drill collars 28, down to the drill bit 32, including downhole motor 40. The drill collars 28, which also may be non-magnetic so as not to interfere with the MWD measurements, are used in accordance with conventional techniques to add weight to the drill bit 32 and to stiffen the BHA 26, thereby enabling the BHA 26 to transmit weight to the drill bit 32 without buckling. The weight applied through the drill collars 28 to the bit 32 permits the drill bit to penetrate underground formations.

As the drill bit 32 operates, drilling fluid or mud is pumped from a mud pit 34 at the surface through the hose 37, into the tubing 24, and to the drill bit 32. After flowing through the drill bit 32, the drilling mud rises back to the surface through the annular area between the tubing 24 and the borehole 18, where it is collected and returned to the mud pit 34 for filtering. The drilling mud is used to lubricate and cool the drill bit 32 and to remove cuttings from the borehole 18. The drilling mud may also perform a number of other functions, which could include providing operating power to the downhole motor or other components downhole. The downhole motor or turbine 40 may be used downhole to rotate the drill bit 32.

A downhole controller (not specifically shown in FIG. 1) located in the downhole instrument sub 60 or elsewhere in the BHA controls the operation of the telemetry transmitter 28 and orchestrates the operation of the MWD and LWD sensors and other downhole instrument sub components. The controller may include data encoding circuitry that produces digitally encoded electrical data signals representative of the measurements obtained by the formation sensors and directional sensors. The controller also processes the data received from the sensors and produces encoded signals for transmission to the surface via the telemetry transmitter. The controller may also make decisions based upon the processed data.

Figure 2:
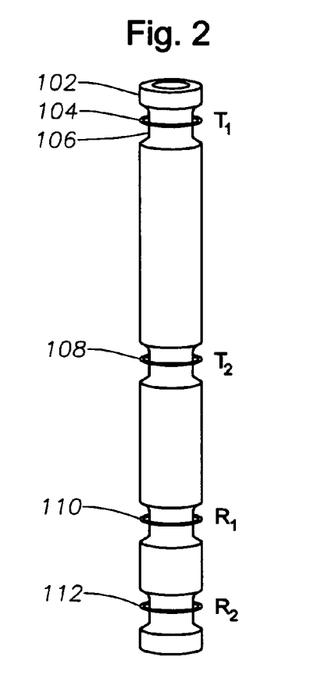
FIG. 2 shows antenna loops of a resistivity tool wrapped around the outside of a drill collar.

Referring now to FIG. 2, a resistivity tool subassembly 102 is shown. The subassembly 102 is provided with one or more regions 106 of reduced diameter. A wire coil 104 is placed in the region 106 and spaced away from the surface of subassembly 102 by a constant distance. Coils 104 and 108 are transmitter coils and coils 110 and 112 are receiving coils. In operation, transmitter coil 104, 108 transmits an interrogating electromagnetic signal which propagates through the wellbore and surrounding formation. Receiver coils 110, 112 detect the interrogating electromagnetic signal and transmits it to the controller, where it is digitized and processed. The controller calculates the electromagnetic signal's amplitude attenuation and phase shift between coils 110 and 112. From the amplitude attenuation and phase shift, the resistivity of the formation can be estimated using conventional techniques.

Figure 3:
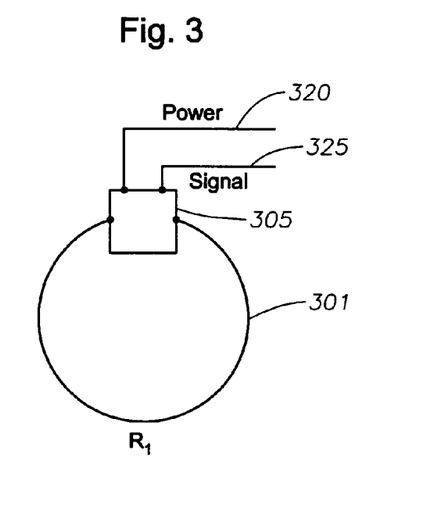
FIG. 3 is a schematic of a conventional resistivity antenna.

A problem common to conventional designs is the degrading signal quality of the waveform signal as it is transmitted from the receiver to the controller. As explained with reference to FIG. 2, it is known to use conductive loops of wire as the transmitter(s) and receiver(s), one loop per antenna. Each loop terminates and couples at each end at a circuit card referred to as a "junction box" that is housed in a pressure housing, as shown in FIG. 3. FIG. 3 includes a receiver 301 having two ends that terminate at circuit card 305. Line 320 that supplies power to electronics in circuit card 305 and signal line 325 that carries the analog waveform from circuit card 305 are also shown. The circuit card 305 is generally an industry standard-size circuit board that includes receiver circuitry to detect electrical signals and a transmitter for transmitting the analog waveform to the controller. It can be replaced by any other appropriate circuitry for impedance matching and for transmitting the analog waveform to the controller.

A controller is conventionally located up to several feet from at least one of the receiving antennas. The wiring between the antennas and the controller carries weak (nanovolt level) analog signals, however. This makes these signals susceptible to noise, grounding, pick-up, cross-talk and vibration issues. Each of these issues adversely affects the ability to measure phase shift and signal amplitude accurately, and therefore measurements of formation resistivity.

Figure 4:
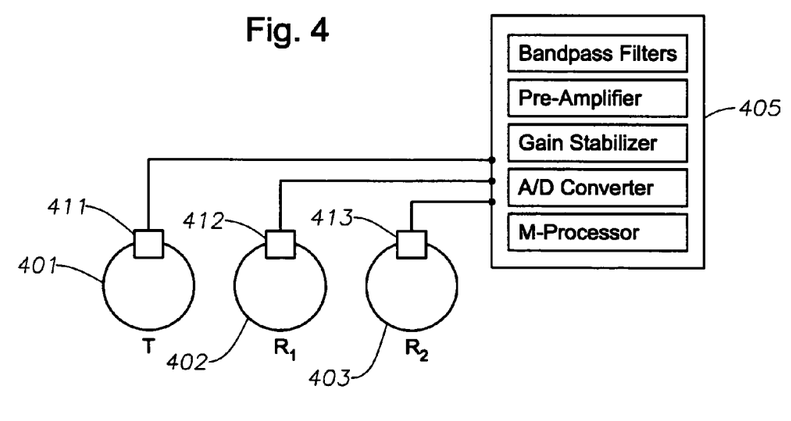
FIG. 4 is a schematic diagram of a resistivity tool and controller located remotely.

As shown schematically in FIG. 4, transmitter coil 401, receiver coil 402, and receiver coil 403 each couple to controller 405 through respective circuit cards 411, 412, and 413. The transmitter circuit card has impedance-matching circuitry whereas the receiver circuit card has filtering electronics. Controller 405 includes a microprocessor as well as conditioning and processing components for each receiver channel. For example, each receiver channel may include bandpass filters, a pre-amplifier, gain stabilizer, and an analog-to-digital converter. The processor operates on the waveform data from each receiver coil to establish the phase shift and attenuation between or among the waveforms to generate formation resistivity data.

At the same time, deeper wells are being drilled. Pressures and temperatures become significantly higher at greater well depths. At temperatures approaching 180° Celsius, the performance of existing electronic technologies degrades or fails. This is especially true when these electronics are exposed to these temperatures over the long term. At high temperatures, CMOS electronics tend to be subject to significant leakage. Also, the threshold gate voltages tend to change with temperature, making electronics performance unreliable.

Another environmental effect at elevated temperatures is enhanced electromigration. Electromigration is the movement of metal atoms caused by the flow of electrons. Electromigration can lead to the thinning and separation of interconnections within an integrated circuit. Over time, metal migration tends to degrade performance of the electronics when these electronics are exposed to high temperature.

Efforts have been made to design electronics for use at high temperatures (i.e., above 185° Celsius). However, these efforts have not yielded an ideal, or in many cases even satisfactory, solution. For example, because the electronics are resident in the borehole for only a limited time, the electronics may be shielded from the elevated temperatures by insulation, heat-absorbing materials, and/or active refrigeration. These traditional approaches to configuring electronics for elevated temperature operation have been motivated by the poor performance of many electronics when they are directly exposed to environments with temperatures above 185 Celsius. However, these approaches greatly increase the size of the electronics package, and in the case of active refrigeration, greatly increase the energy consumption by the electronics package. Further, these approaches have not suggested a solution for providing electronics that can remain resident in a well indefinitely.

Figures 5, 6A, 6B:
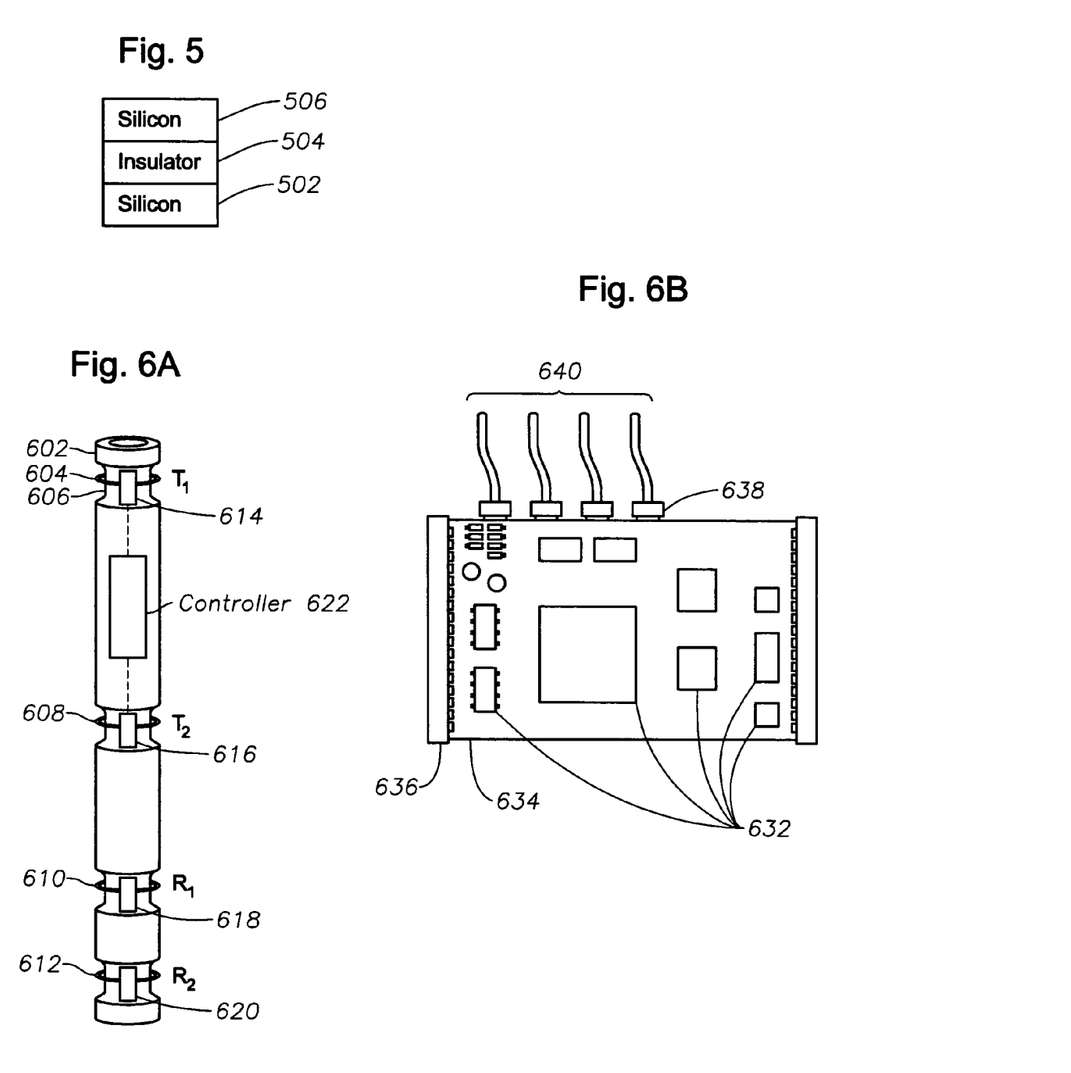
FIG. 5 shows a conventional silicon-on-insulator semiconductor design.
FIG. 6A shows an external view of a resistivity tool according to one embodiment of the invention.
FIG. 6B is a schematic diagram of receiver electronics proximate a receiver coil antenna.

Another technology that can be used in high temperature applications is known as silicon-on-insulator (SOI). Referring to FIG. 5, this technology generally describes a three-layer construction. Silicon is used as the first, bottom layer. The second, middle layer is made from a type of insulator known to those of ordinary skill. The third top layer is made from silicon. This construction has been satisfactory but is still subject to improvement.

Space limitations downhole can be severe, and part prevent design or installation of a cooling system to cool these electronics even if it were otherwise feasible. A resistivity tool is needed that overcomes these transmission problems. Ideally, it would be desirable to create a resistivity tool that is suitable for use at temperatures well in excess of 200° C. It is desirable for this resistivity tool to stay resident in wells indefinitely at elevated temperatures. Ideally, such data acquisition systems would be compact and able to withstand vibration.

BRIEF DESCRIPTION OF THE DRAWINGS

For a more detailed description of the preferred embodiment of the present invention, reference will now be made to the accompanying drawings, wherein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

FIGS. 6A and 6B illustrate a resistivity tool design according to one embodiment of the invention. Referring to FIG. 6A, resistivity tool subassembly 602 is shown. The subassembly 602 is provided with one or more regions 606 of reduced diameter. A wire coil 604 is placed in the region 606 and spaced away from the surface of subassembly 602 by a constant distance. Coils 604 and 608 are transmitter coils and coils 610 and 612 are receiving coils. In operation, transmitter coils 604, 608 transmits an electromagnetic signal which propagates through the wellbore and surrounding formation. Receiver coils 610, 612 detect the electromagnetic signal and transmits it to the controller. A controller 622 may be located remotely from the receiver coils (such as inside a bottom hole assembly) and includes at least a microprocessor. A source of power is also necessary in the system.

A circuit card 614 may couple to transmitter coil 604 between its terminal ends, circuit card 616 may couple to transmitter coil 608 between its terminal ends, circuit card 618 may couple to receiver coil 610 between its terminal ends, and circuit card 620 may couple to receiver coil 612 between its terminal ends. Each circuit card 618, 620 contains circuitry to preprocess the signal from the receiver coil. As used herein, the term "couple" includes any appropriate manner of communication, including a physical connection or inductive coupling.

FIG. 6B shows a number of packaged integrated circuit chips 632 mounted on a circuit card 634. The circuit card 634 is shown attached to a connector 636 suitable for connecting the circuit card 634 to a receiver coil. There may also be short leads between receiver antennae and receiver electronics. Also attached to the circuit card 634 are connectors 638 suitable for connecting the circuit card to a microprocessor, power supply, or other appropriate device. The circuit card 634 provides physical support and electrical interconnections for the packaged chips 632, connectors 636, 638, and other components attached to the card. The illustration of FIG. 6B is exemplary only, and it is left to the designer to determine what connections and integrated circuits are appropriate for any given circuit card.

Each chip package 632 can take the form of a multi-chip module, i.e., a package having a substrate upon which are mounted multiple integrated circuit die. The substrate provides physical support and electrical interconnections between the multiple die and also between the die and external pins or pads.

In one embodiment, each circuit card 618 and 620 contains receiver electronics to pre-process the waveform detected by the respective receiver coil and sent to the controller. Each circuit card 618 and 620 also couples to a remote power supply, and to a microprocessor, preferably in the controller. A single cable may carry both power and the transmitted waveform signal to and from receiver electronics, or the waveform signal and power may travel on separate transmission lines.

The invention is not limited by the number of receiver coils or transmitter coils that are included in the resistivity tool. Any appropriate number of receiver coils may be employed, and additional transmitter coils added. The invention also includes variation among the electronics associated with each coil, e.g. each set of receiver electronics may or may not be identical to any other receiver electronics.

The receiver electronics may include any or all of the following, as appropriate:
1. a pre-amplifier that increases the signals to be transmitted over the wire to the microprocessor;
2. filters coupled to the signal cable, where the signal cable is configured to deliver power to the receiver electronics;
3. one or more bandpass filters to eliminate noise;
4. electronics to enable the receiver to be tunable;
5. a mixer;
6. an analog-to digital converter;
7. a digital/signal processor;
8. other digital or analog circuitry.

Figure 6C:
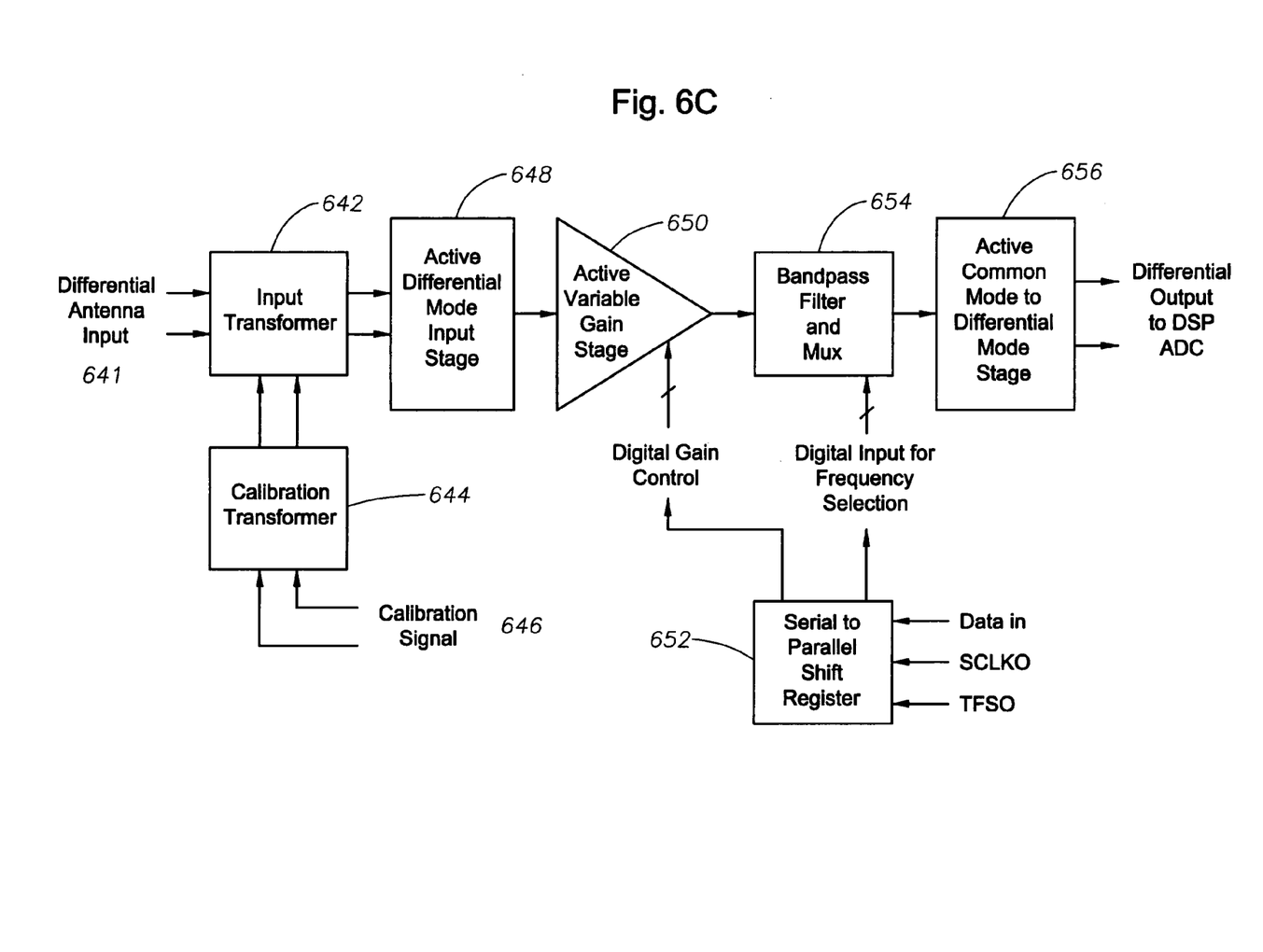
FIG. 6C is a schematic diagram of one embodiment of the invention.

FIG. 6C shows a schematic according to one embodiment of the invention. The signal from the receiver enters into an input transformer 642. Calibration signal 646 enters into calibration transformer 644, where it is then transmitted to input transformer 642. The output signal from the input transformer 642 is provided to an active differential mode input stage 648. The active differential mode input stage 648 connects to an active variable gain stage 650 on the output side of the active differential mode input stage 648. The active variable gain stage 650 is controlled by the digital gain control from the controller (controller not shown in FIG. 6C) via a serial to parallel shift register 652. Bandpass filters and a multiplexer 654 connects to the output side of the active variable gain stage 650. Serial to parallel shift register 652 also connects to the bandpass filters 654 to affect the frequency band selected by the bandpass filters. Output from the Bandpass filters and a multiplexer 654 connects to active common mode to differential mode stage 656. Output from the active common mode to differential mode stage 656 inputs to an analog to digital converter.

The receiver electronics may include other components as well. The decision on the particular electronic components placed near the receiver antenna is left to the tool designer. It can be appreciated that placement of pre-processing electronics proximate the receiver results in improved performance of the resistivity tool.

Amplification of the received signal at the receiver by a pre-amplifier improves the signal-to-noise ratio of the analog waveform signal after it is transmitted from the receiver to the microprocessor. The noise remains the same while the transmitted signal is amplified so signal-to-noise ratio is improved.

It can be further appreciated that numerous other problems, such as cross-talk and interference can be eliminated or substantially reduced by transformation of the waveform at a receiver into a digital signal, which is then transmitted to the microprocessor. Thus, it is believed desirable to pre-process each waveform signal from a receiver to a digital signal prior to transmission to the controller.

The prior art circuit card referred to with reference to FIG. 3 generally has an industry-standard size. One desirable aspect of embodiments of the invention is that the receiver electronics may be placed on a circuit card having the same size as the known impedance-matching circuit card of conventional designs. Consequently, a circuit card built according to at least one embodiment of the invention may be placed in the same location between the terminal ends of a transmitter coil or receiver coil as a conventional inductance-matching circuit card. Having the industry-standard size for a circuit card built according to the invention is expected to simplify installation and design, and increase the commercial feasibility of the invention.

It should be noted that, although advantageous, placement of the electronics in the circuit card is not a requirement of the invention. One embodiment of the invention places electronics for each transmitter and receiver at most a foot from the respective transmitter or receiver. More preferably, the electronics are less than six inches from the respective transmitter or receiver.

Figure 7A:
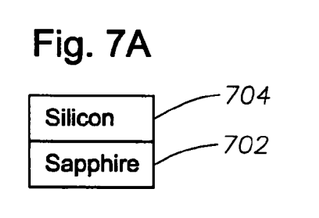
FIG. 7A is a two-layer silicon-on-sapphire design suitable for one embodiment of the invention.
Figure 7B:
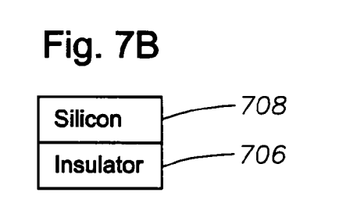
FIG. 7B is a two-layer silicon-on-insulator design suitable for one embodiment of the invention.

Silicon on insulator may be used to implement the invention, and the broader embodiments of the invention include a silicon-on-insulator design as shown in FIG. 7B. The technology uses silicon films grown or deposited on insulating substrates. By manufacturing integrated circuits onto an insulating substrate, the effects of high temperature operation, such as leakage current through the substrate, may be reduced so that the high temperature operation does not severely and/or adversely affect operation. The insulator upon which the components are constructed may be any suitable insulator, such as sapphire and spinel. The silicon film may be masked etched and doped to create components, such as transistors, diodes, resistors and capacitors, which components in combination perform desired functions. Typically, the wafer substrate is about 1 mm thick, while the semiconducting layer may (for example) be $10^{-8}$ to $10^{-4}$ m thick. The thickness of the conducting layers may be around 10-100 nm thick.

By creating the transistors as islands on an insulating substrate, stray leakage paths are eliminated. Such current leakage paths are a primary source of performance degradation or failure at elevated temperatures, and their elimination allows operation at temperatures much higher than would otherwise be possible.

Some embodiments of the invention may be implemented by use of silicon-on-sapphire technology. Implementation by hybrid, ASIC, or silicon on insulator designs may also be feasible but it is believed that silicon on sapphire (SOS) is particularly suited to miniaturize the receiver electronics while achieving high temperature operation.

One advantage of usings silicon-on-sapphire as that term is used here is its two-layer construction. Referring to FIG. 7A, the term silicon-on-sapphire refers to an insulating base layer made of sapphire coated by a silicon layer. Literally speaking, this is silicon on an insulator. However, it differs from the use of the term silicon on insulator or SOI as that term is used in conjunction with FIG. 5.

One difficulty when miniaturizing electronics is often the parasitic capacitances that arise. These parasitic capacitances interfere with the operation of the electronics. Thus, when miniaturization of electronics is being sought, it is desirable to minimize parasitic capacitances. Referring to FIG. 5, it can be seen that the silicon-on-insulator (three layer) design is an insulator layer sandwiched between two layers of conductive silicon. As can be appreciated by one of ordinary skill in the art, an insulator between two conductors is generally analogous to the design for a basic capacitor. Thus, use of this three layer design tends to result in parasitic capacitances. Use of a two-layer silicon-on-insulator design, such as silicon on sapphire, reduces the inherent parasitic capacitance of the design because a two layer design is being used, not a three layer design (i.e. a conductor-resistor-conductor sandwich). Reduction of the capacitance allows higher frequencies to be used, and lowers power requirements. Limited current densities also protect against electromigration.

Figure 8:
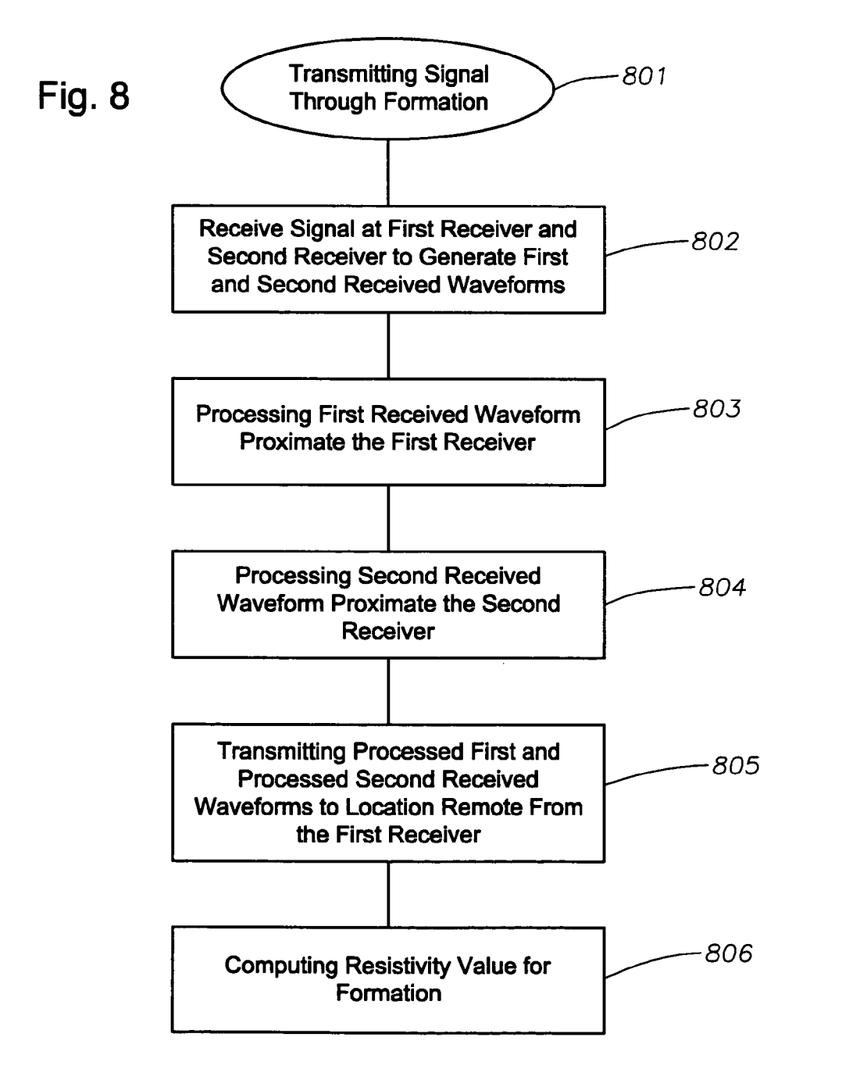
FIG. 8 is a flow diagram according to one embodiment of the invention.

FIG. 8 is a flowchart of a method according to one embodiment of the invention. A signal is transmitted through the formation at step 801. The signal is received at a first and a second receiver placed on the outside of a drill collar at step 802. Also at step 802, the receivers generate first and second received waveforms. The first and second waveforms are processed proximate the first and second receivers, respectively, at steps 803 and 804. Steps 803 and 804 are expected to generally occur simultaneously. At step 805, the processed first received waveform and processed second received waveform are transmitted to a location remote from the first receiver (such as a controller). The resistivity value is computed for the formation at step 806.

The invention minimizes interference, noise and crosstalk issues on the wires from a resistivity tool receiver to the conditioning electronics by placement of the conditioning/electronics proximate the receiver antenna, preferably at the location of the receiver circuit cards. Historically, this has been prohibitive because of space limitations, and also because the electronics would be located near the outer surface of the drill collar.

While preferred embodiments of this invention have been shown and described, modifications thereof can be made by one skilled in the art without departing from the spirit or teaching of this invention. The embodiments described herein are exemplary only and are not limiting. Many variations and modifications of the system and apparatus are possible and are within the scope of the invention. Accordingly, the scope of protection is not limited to the embodiments described herein, but is only limited by the claims which follow, the scope of which shall include all equivalents of the subject matter of the claims.

What is claimed is:

1. A resistivity tool, comprising:
   a drill collar having an inside surface and an outside surface;
   a transmitter coil disposed around said outside surface of said drill collar;
   a receiver coil disposed around said outside surface of said drill collar; and
   receiver electronics coupled to said receiver coil, said receiver electronics being on said outside surface of said drill collar.

2. The resistivity tool of claim 1, said receiver coil having a first end and a second end, said first end and said second end terminating at said receiver electronics.

3. The resistivity tool of claim 2, said receiver electronics including an amplifier.

4. The resistivity tool of claim 1, wherein said receiver electronics are less than one foot from said receiver coil.

5. The resistivity tool of claim of claim 1, wherein said receiver electronics are within six inches from said receiver coil.

6. The resistivity tool of claim 1, said receiver electronics including an amplifier.

7. The resistivity tool of claim 6, said receiver further comprising a bandpass filter.

8. The resistivity tool of claim 6, said receiver being a tuneable antenna.

9. The resistivity tool of claim 6, said receiver further comprising a mixer.

10. The resistivity tool of claim 6, said receiver further comprising a analog-to-digital converter.

11. The resistivity tool of claim 1, wherein said receiver electronics comprising an upper layer of silicon above a lower layer of insulator, said lower layer of insulator not being laid on a base layer of silicon.

12. The resistivity tool of claim 1, wherein said insulator is sapphire.

13. The resisitivity tool of claim 1, further comprising:
   a microprocessor; and a transmission medium from said receiver electronics to said microprocessor;

wherein said microprocessor is more than one foot from said receiver electronics.

14. The resisitivity tool of claim 1, further comprising:
a microprocessor; and
a cable from said receiver electronics to said microprocessor;
said cable carrying both power and data signals between said receiver electronics and said microprocessor.

15. The resistivity tool of claim 1, said drill collar including a channel with said receiver coil being disposed in said channel.

16. The resistivity tool of claim 1, said receiver electronics being physically connected to said receiver.

17. The resistivity tool of claim 1, said receiver electronics being inductively coupled to said receiver.

18. The resistivity tool as defined in claim 1 wherein the receiver electronics are coupled to an exterior surface of the drill collar.

19. A resistivity tool, comprising:
a drill collar defining an inside surface and an outside surface;
a transmitter coil disposed on the outside surface of said drill collar;
a receiver coil disposed on the outside surface of said drill collar; and
receiver electronics coupled to the receiver coil, the receiver electronics in the outside surface of the drill collar.

20. The resistivity tool according to claim 19 wherein the receiver electronics and the receiver coil disposed proximate to each other in the outside surface of the drill collar.

21. The resistivity tool according to claim 19, said receiver coil having a first end and a second end, said first end and said second end terminating at said receiver electronics.

* * * * *